US012298795B2

(12) United States Patent
Kathuria et al.

(10) Patent No.: US 12,298,795 B2
(45) Date of Patent: May 13, 2025

(54) FLIPPED VOLTAGE FOLLOWER LOW-DROPOUT REGULATOR WITH FREQUENCY COMPENSATION

(71) Applicants: Advanced Micro Devices, Inc., Santa Clara, CA (US); ATI Technologies ULC, Markham (CA)

(72) Inventors: Achal Kathuria, Sunnyvale (CA); Tom Moiannou, Markham (CA); Pradeep Jayaraman, San Jose, CA (US); Karthik Gopalakrishnan, Cupertino, CA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 239 days.

(21) Appl. No.: 17/977,289

(22) Filed: Oct. 31, 2022

(65) Prior Publication Data

US 2024/0143007 A1 May 2, 2024

(51) Int. Cl.
*G05F 1/575* (2006.01)
*G05F 1/565* (2006.01)
*G05F 1/59* (2006.01)
*H03F 3/45* (2006.01)

(52) U.S. Cl.
CPC .............. *G05F 1/575* (2013.01); *G05F 1/565* (2013.01); *G05F 1/59* (2013.01); *H03F 3/45192* (2013.01)

(58) Field of Classification Search
CPC . G05F 1/565; G05F 1/575; G05F 1/59; H03F 3/45192
See application file for complete search history.

(56) References Cited

FOREIGN PATENT DOCUMENTS

CN          105652946 A   *  6/2016   .............. G05F 1/563

OTHER PUBLICATIONS

Ahuja, B., "An Improved Frequency Compensation Technique for CMOS Operational Amplifiers," IEEE Journal of Solid-State Circuits, vol. SC-18, No. 6, Dec. 1983, pp. 629-633.
Hazucha, P., et al., "Area-Efficient Linear Regulator With Ultra-Fast Load Regulation," IEEE Journal of Solid-State Circuits, vol. 40, No. 4, Apr. 2005, pp. 933-940.
Or, P., and Leung, K., "An Output-Capacitorless Low-Dropout Regulator With Direct Voltage-Spike Detection," IEEE Journal of Solid-State Circuits, vol. 45, No. 2, Feb. 2010, pp. 458-466.

* cited by examiner

*Primary Examiner* — Jue Zhang
(74) *Attorney, Agent, or Firm* — Zagorin Cave LLP

(57) ABSTRACT

A voltage regulator includes an input power supply node, an output regulated power supply node, a flipped voltage follower circuit, and a compensation capacitor. The flipped voltage follower circuit includes an output transistor configured as a common-source amplifier circuit. A source terminal of the output transistor is coupled to the input power supply node and a drain terminal of the output transistor is coupled to the output regulated power supply node. The flipped voltage follower circuit includes a folded cascode feedback circuit. The folded cascode feedback circuit includes a folding node. The folded cascode feedback circuit is configured to receive an output regulated voltage on the output regulated power supply node and to provide a feedback signal to a gate terminal of the output transistor. The compensation capacitor is coupled to the output regulated power supply node and the folding node.

20 Claims, 5 Drawing Sheets

FLIPPED VOLTAGE FOLLOWER LOW-DROPOUT REGULATOR WITH FREQUENCY COMPENSATION

BACKGROUND

Description of the Related Art

In general, low-dropout regulators are linear voltage regulator circuits that provide a steady constant output voltage to circuits that are sensitive to power supply voltage variations and noise in integrated circuits and systems-on-a-chip (SOCs). Low-dropout regulators can operate at a low potential difference between input voltage and output voltage and may include large output decoupling capacitance included to suppress noise. Low dropout regulator circuits with large feedback loop unity gain bandwidths for wide dynamic range of load currents typically consume substantial amounts of power. A typical low-dropout regulator includes an operational amplifier with compensation of its frequency response (i.e., adjustments to the gain and phase of the output signal) to prevent unintentional positive feedback that would cause the amplifier to oscillate. Conventional frequency compensation techniques reduce speed and have poor power supply noise rejection. Accordingly, improved techniques for regulating voltage are desired.

SUMMARY OF EMBODIMENTS OF THE INVENTION

In at least one embodiment, a voltage regulator includes an input power supply node, an output regulated power supply node, a flipped voltage follower circuit, and a compensation capacitor. The flipped voltage follower circuit includes an output transistor configured as a common-source amplifier circuit. A source terminal of the output transistor is coupled to the input power supply node and a drain terminal of the output transistor is coupled to the output regulated power supply node. The flipped voltage follower circuit includes a folded cascode feedback circuit. The folded cascode feedback circuit includes a folding node. The folded cascode feedback circuit is configured to receive an output regulated voltage on the output regulated power supply node and to provide a feedback signal to a gate terminal of the output transistor. The compensation capacitor is coupled to the output regulated power supply node and the folding node.

In at least one embodiment, a method for voltage regulation includes receiving an input power supply voltage on an input power supply node. The method includes regulating a regulated output voltage on an output power supply node using a flipped voltage follower circuit, the input power supply voltage, and a feedback signal. The method includes compensating a frequency response of the regulated output voltage by capacitively coupling the output power supply node to a folding node of the flipped voltage follower circuit.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

A flipped voltage follower low-dropout regulator having low leakage current and fast load regulation includes a folded cascode feedback network and a compensation capacitor coupled between an output node and a folding node to provide frequency compensation. The folded cascode network includes an inherent common-gate amplifier circuit. The compensation capacitor has a size the provides the required frequency compensation and phase margin. In an embodiment, compensation capacitor $C_C$ is approximately $C_M/A_{CG}$, where $A_{CG}$ is the gain of the inherent common-gate amplifier and $C_M$ is a Miller compensation capacitance. Feedback via compensation capacitor $C_C$ is amplified by the inherent common-gate amplifier circuit. The flipped voltage follower low-dropout regulator has a first transient response to a change in a current load that is at least one order of magnitude faster than a second transient response to a second change in a reference target voltage.

Figure 1:
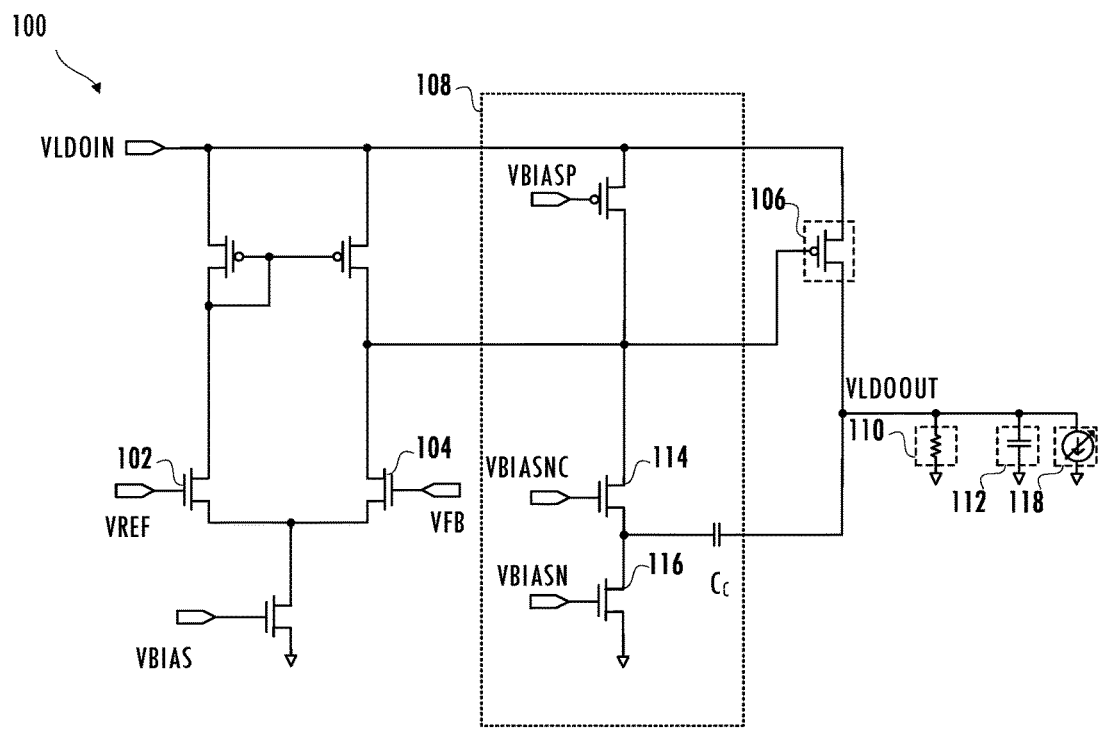
FIG. 1 illustrates a circuit diagram of a conventional low-dropout regulator using a cascode frequency compensation topology.

Referring to FIG. 1, a conventional low dropout regulator circuit uses input voltage VLDOIN on an input power supply node to regulate output voltage VLDOOUT on an output power supply node. Low dropout regulator 100 is a two-stage amplifier that uses a cascode compensation topology (i.e., Ahuja compensation). In general, cascode refers to series connection of a common-source device (e.g., transistor 116), which has high impedance node, to a common gate device (i.e., a cascode transistor, e.g., transistor 114) to increase output impedance. The folding technique uses an input device(s) of one type (e.g., output transistor 106, which is a p-type transistor) and common gate amplifier of another type (e.g., transistor 114, which is an n-type transistor) to achieve level shifting. An input differential pair of transistors (e.g., transistors 102 and 104) compares feedback voltage VFB to reference voltage VREF and adjusts a voltage provided to compensation feedback network 108 and the gate of output transistor 106 accordingly.

The two-stage amplifier of low dropout regulator 100 uses an n-type common-gate amplifier network and compensation capacitor $C_C$ for frequency compensation. Compensation feedback network 108 requires a substantial bias current to achieve a target load regulation speed and a target power supply rejection ratio. In some embodiments, to obtain sufficient load regulation speeds and power supply noise rejection, the current bias of the differential pair stage controlled by voltage VBIAS and compensation feedback network 108 controlled by voltages VBIASP, VBIASN, and VBIAS NC, provide substantially similar currents. In some embodiments, the requirements for low dropout regulator 100 require the bias current of compensation feedback network 108 to be two to three times the bias current in the differential pair stage. Leaker circuit 118 ensures a predetermined minimum load current. In addition, this low dropout regulator 100 has load-dependent systematic offset that may be canceled by changing a reference signal. Since the systematic offset is dependent on the load current, changes to the reference signal to cancel the systematic offset is not feasible for all load conditions, thus limiting the performance of this topology.

Figure 2:
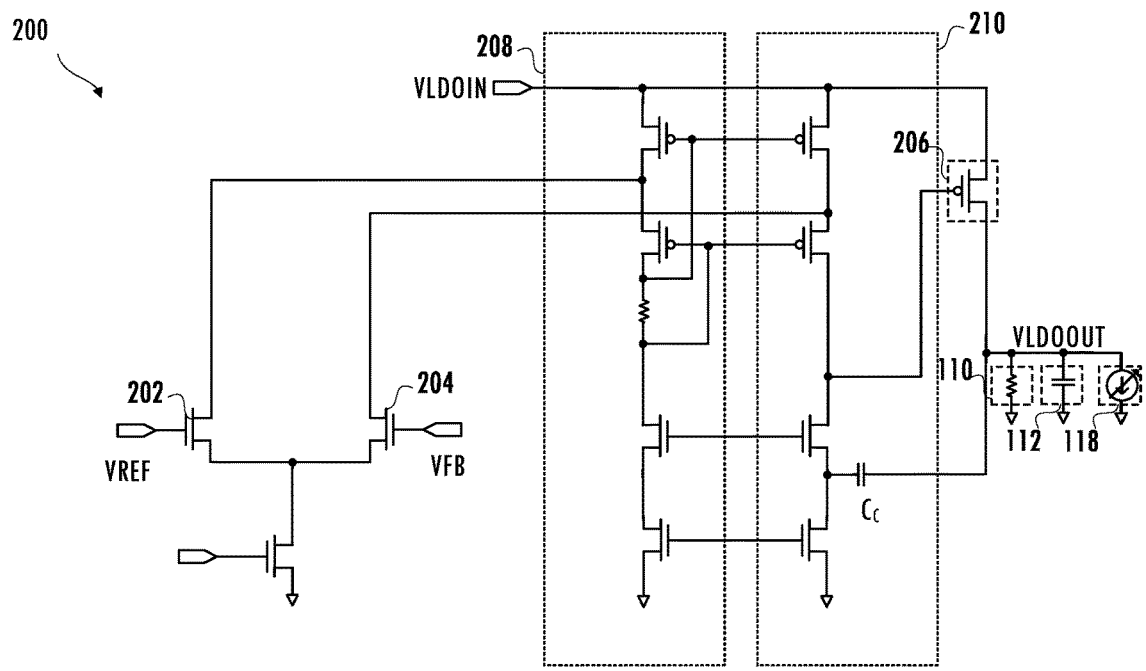
FIG. 2 illustrates a circuit diagram of a conventional folded cascode low-dropout regulator using a cascode frequency compensation topology.

FIG. 2 illustrates folded cascode low-dropout regulator 200 including output transistor 206, differential cascode branch 208, and compensation feedback network 210. Differential input transistor 202 is coupled to differential cascode branch 208 and differential input transistor 204 is coupled to compensation feedback network 210. Compensation feedback network 210 requires substantial bias current to achieve target load regulation speeds and power supply rejection. Accordingly, the current supplied to low-dropout regulator 200 is larger than the current supplied to low-dropout regulator 100 of FIG. 1. Low-dropout regulator 200 of FIG. 2 also includes leaker circuit 118 to ensure a predetermined amount of load current.

Figure 3:
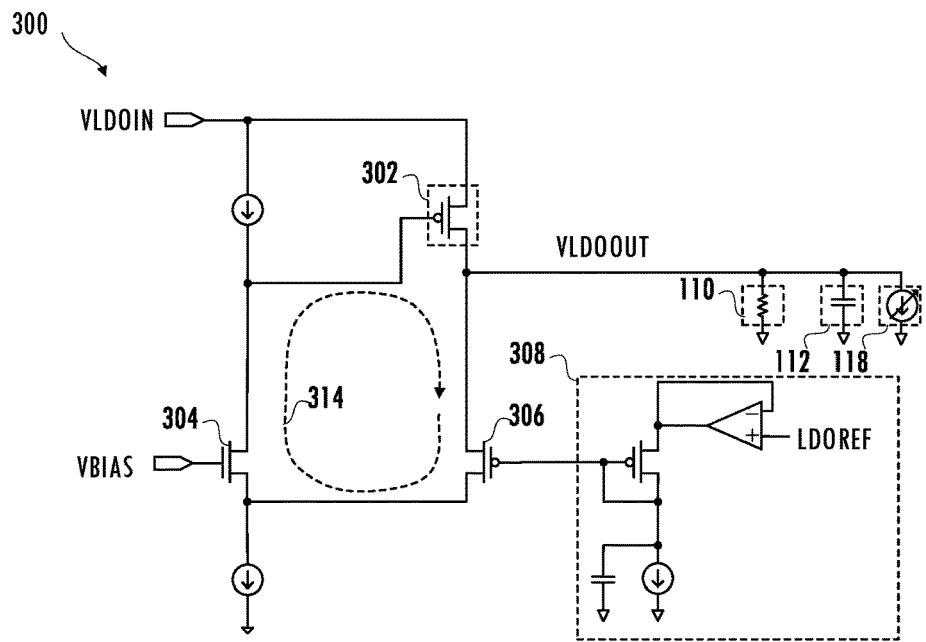
FIG. 3 illustrates a circuit diagram of an exemplary flipped voltage follower low-dropout regulator.
Figure 4:
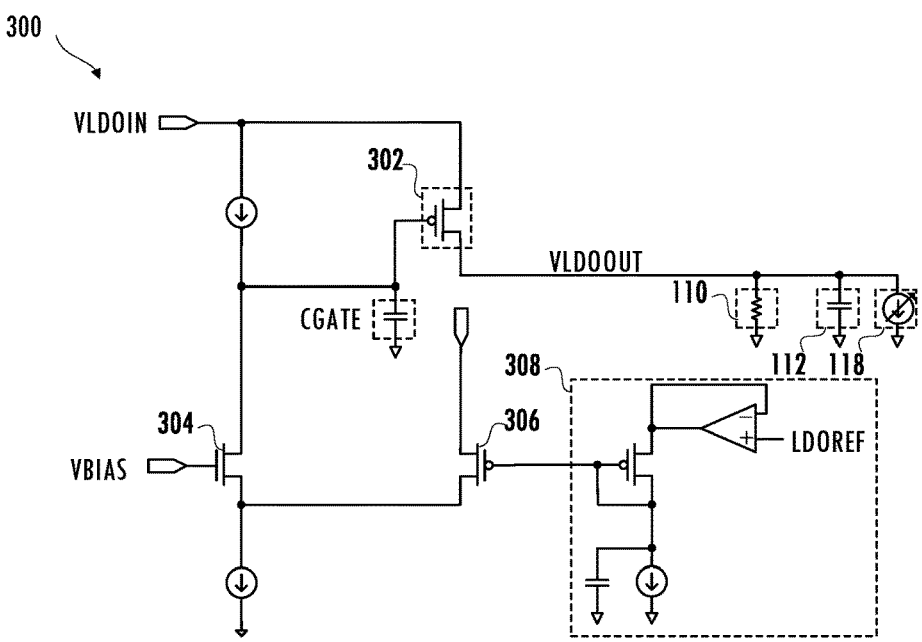
FIG. 4 illustrates a circuit diagram of the exemplary flipped voltage follower low-dropout regulator of FIG. 3 in an open loop configuration.

Referring to FIG. 3, in some embodiments (e.g., embodiments having a relatively large load that does not vary substantially), flipped voltage follower low-dropout regulator 300 has a large unity gain bandwidth and a fast response to load transients. A voltage follower (i.e., unity-gain amplifier, buffer amplifier, or isolation amplifier) is an operational amplifier circuit having a voltage gain of one. A folded cacscode structure provides sufficient headroom for operation where input signal VLDOIN is 1.2V and output signal VLDOOUT is 0.8 V. Output transistor 302 is a p-type transistor that is substantially larger (i.e., at least one order of magnitude larger, e.g., twenty times larger or one hundred times larger) than transistor 304 and common-gate transistor 306 and allows relatively low dropout. The flipped voltage follower topology has a relatively fast response to load transients if the flipped voltage follower feedback loop (e.g., feedback loop 314) has a large unity gain bandwidth. However, the relatively large capacitance of output transistor 302 causes the output to take a relatively long time to respond to transients on the input power supply node. In an embodiment, reference generator 308 provides a stable gate bias voltage for p-type transistor 306 that is suitable to generate output signal VLDOOUT approximately equal to reference signal LDOREF. In at least one embodiment, for output signal VLDOOUT to be approximately equal to reference signal LDOREF, the gate bias voltage for p-type transistor 306 is $LDOREF-VGS_{306}$, where $VGS_{306}$ is the gate-to-source voltage of the diode connected p-type transistor in reference generator 308. The open loop configuration of low dropout regulator 300 is illustrated in FIG. 4. In general, the loop bandwidth is wide since the dominant pole is a function of the gate capacitance $C_{gate}$ of output transistor 302. If the frequency of the second dominant pole is larger than the unity gain bandwidth, the unity gain bandwidth of the flipped voltage follower feedback loop is:

$$\omega_{unity\text{-}gain} = gm_{302}/C_{gate}.$$

Frequency $\omega_2$ of the second dominant pole is:

$$\omega_2 = \frac{1}{ro_{302}||r_{110} \times C_{112}}.$$

For a wide current load, frequency $\omega_2$ varies by an order of magnitude. To obtain sufficient phase-margin and settling behavior, cot should be greater than unity gain frequency $\omega_{unity\text{-}gain}$ for all load conditions. For a wide low-dropout regulator current load dynamic range and to maintain stability, the flipped voltage follower loop compensation ensures that $\omega_2 > \omega_{unity\text{-}gain}$. Various techniques, described below, may be used for this frequency compensation.

Figure 5:
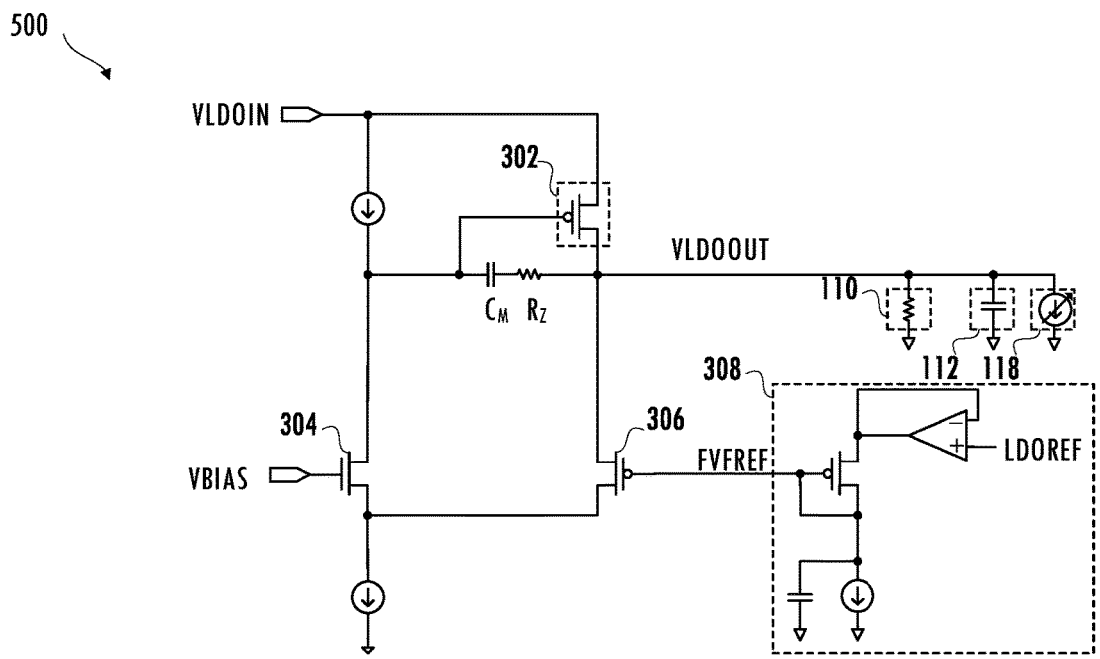
FIG. 5 illustrates a circuit diagram of an exemplary flipped voltage follower low-dropout regulator using Miller compensation with a nulling resistor.
Figure 6:
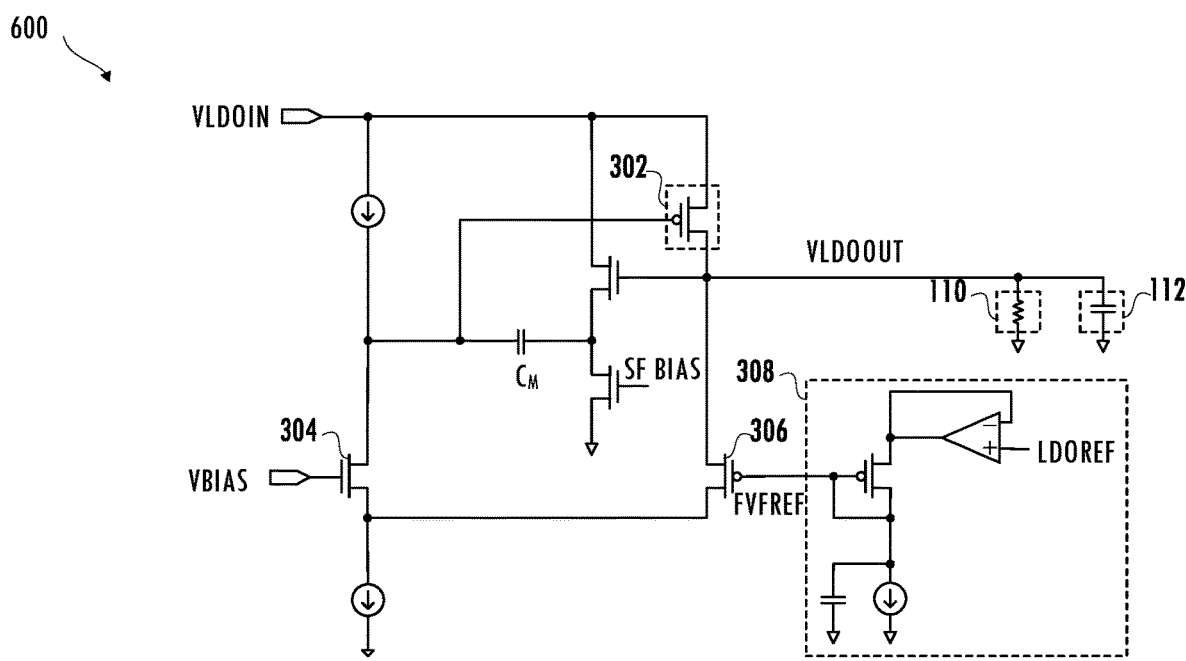
FIG. 6 illustrates a circuit diagram of an exemplary flipped voltage follower low-dropout regulator using Miller compensation with a source follower.

FIG. 5 illustrates flipped voltage follower low dropout regulator 500 with conventional frequency compensation including Miller capacitor $C_M$ and nulling zero resistor $R_Z$ that move a zero of the frequency response from the right-half plane of the frequency response to the left-half plane of the frequency response. The frequency compensation reduces the speed of the flipped voltage follower low dropout regulator and results in poor power supply noise rejection. FIG. 6 illustrates flipped voltage follower low dropout regulator 600 with frequency compensation using a Miller capacitor $C_M$ in series with a source-follower controlled by bias signal SFBIAS. Similar to frequency compensation using Miller compensation and a nulling zero resistor, frequency compensation using a Miller capacitor in series with a source-follower reduces the speed of the flipped voltage follower low dropout regulator and results in poor power supply noise rejection.

Figure 7:
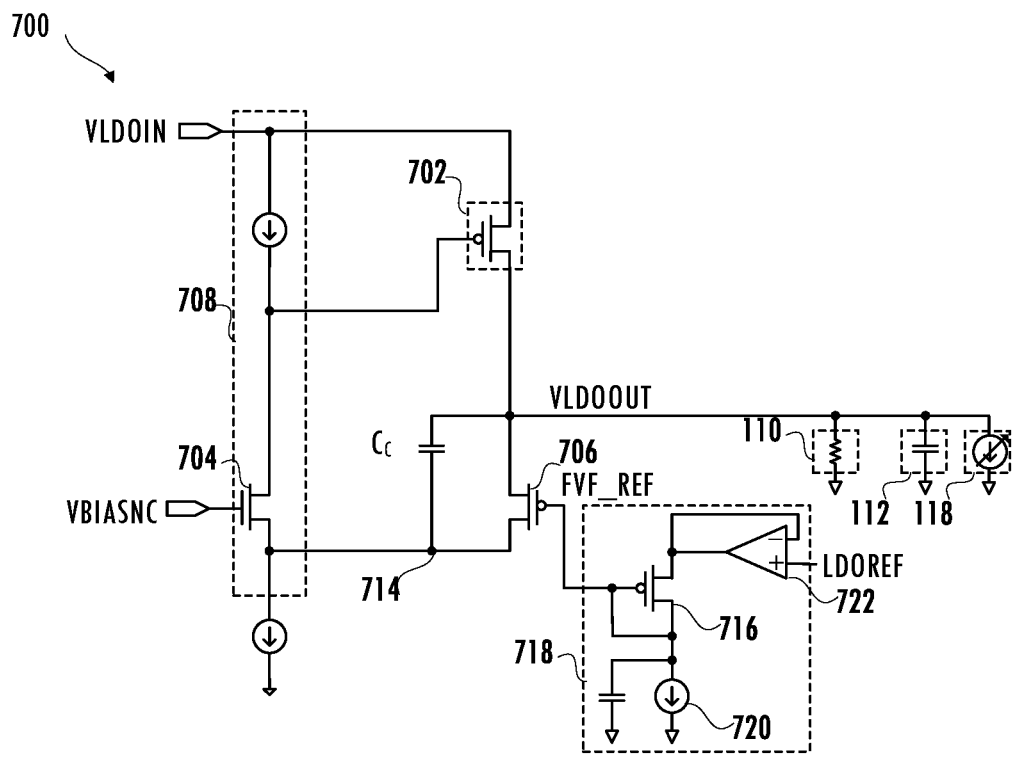
FIG. 7 illustrates a circuit diagram of a flipped voltage follower low-dropout regulator using a modified folded cascode feedback network for frequency compensation consistent with at least one embodiment of the invention.

Referring to FIG. 7, in at least one embodiment, flipped voltage follower low-dropout regulator 700 includes a folded cascode feedback network and compensation capacitor $C_C$ coupled between output node VLDOOUT and folding node 714 to provide frequency compensation. Flipped voltage follower low-dropout regulator 700 has low leakage current and fast load regulation. Output transistor 702 is a p-type transistor that is substantially larger (i.e., at least one order of magnitude larger, e.g., one hundred times larger) than transistor 706 and allows relatively low dropout. The folded cascode network includes inherent common-gate amplifier circuit 708. Compensation capacitor $C_C$ has a size the provides the required frequency compensation and phase margin. In an embodiment, compensation capacitor $C_C$ is approximately $C_M/A_{CG}$, where $A_{CG}$ is the gain of inherent common-gate amplifier 708. Feedback via compensation capacitor $C_C$ gets amplified by inherent common-gate amplifier circuit 708.

Referring to FIGS. 5 and 7, flipped voltage follower low-dropout regulator 700 is a fast load-regulating flipped voltage follower low-dropout regulator and uses a smaller compensation capacitor as compared to other compensation techniques (e.g., $C_C < C_M$). Feedback through compensation capacitor $C_C$ to the gate of output transistor 702 substantially speeds up the response of the low-dropout regulator to fast load transients. Flipped voltage follower low-dropout regulator 700 has a first transient response to a change in a current load that is at least one order of magnitude faster than a second transient response to a second change in a reference target voltage. In addition, flipped voltage follower low-dropout regulator 700 can be easily scaled by scaling compensation capacitor $C_C$ according to a target application while the rest of the circuit is unchanged. For example, compensation capacitor $C_C$ increases with increases to the decoupling capacitor 112.

Figure 8:
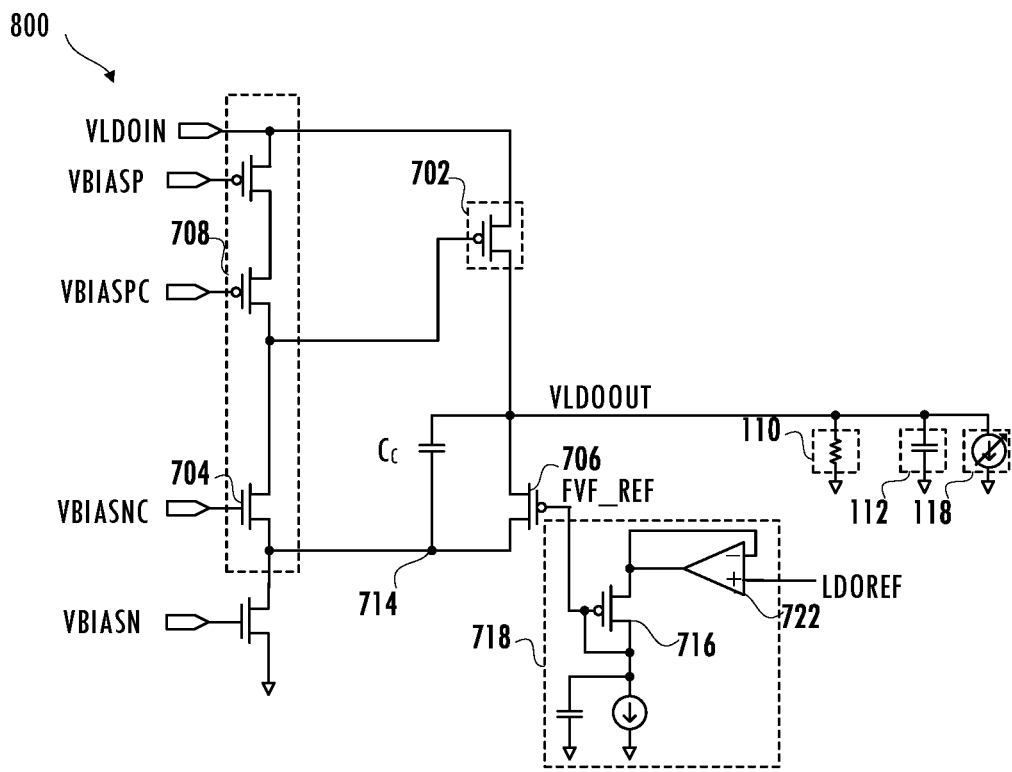
FIG. 8 illustrates a circuit diagram of an exemplary implementation of the flipped voltage follower low-dropout regulator of FIG. 7 consistent with at least one embodiment of the invention.

Referring to FIGS. 7 and 8, low-dropout regulator 800 is an embodiment of flipped voltage follower low-dropout regulator 700 where the current sources are implemented using biased transistors controlled by bias signals VBIASP and VBIASN coupled to cascode transistors controlled by bias signals VBIASPC and VBIASNC. The low-dropout regulator current supply provides current to bias the cascode network, bias the common gate input, and provides current to the flipped voltage follower reference generator. In at least one embodiment, that total current of flipped voltage follower low-dropout regulator 700 is less than 5% of the maximum load current of flipped voltage follower low-dropout regulator 700. In at least one embodiment, leaker circuit 118 is included to achieve a fast transient response (e.g., by sourcing or sinking load current to reduce peaks and dips, as the case may be, at the output due to momentary load transients). Transistor 704 also serves as a leaker path for the low-dropout regulator output and reduces the minimum size of a leaker circuit required and may even eliminate a separate leaker in some embodiments.

In an exemplary embodiment, flipped voltage follower low-dropout regulator 700 responds in a few nanoseconds at low power (e.g., less than 10% of total power of flipped voltage follower low-dropout regulator 700) in response to a 5 mA to 50 mA step where an output decoupling capacitance is 200 pF. In addition, flipped voltage follower low-dropout regulator 700 provides high power supply noise rejection (e.g., approximately 20 dB where the input supply voltage is 1.2 V and the target output voltage is 0.85 V) in the resonance frequency range of a target package (e.g., 50 MHz to 500 MHz). Referring to FIGS. 2, 7, and 8, to achieve the same specifications, the bias current of low-dropout regulator 200 must have a magnitude similar to the bias current of the cascode network of flipped voltage follower low-dropout regulator 700 or flipped voltage follower low-dropout regulator 800. Therefore, the topology of low-dropout regulator 200 requires a larger current supply than low-dropout regulator 700 or low-dropout regulator 800 to achieve the same load regulation speeds and power supply rejection.

In some applications, the target output voltage of flipped voltage follower low-dropout regulator 700 does not equal input voltage LDOREFIN, e.g., the voltage level of output signal VLDOOUT=2×LDOREFIN. However, in a conventional low-dropout regulator application, the feedback factor is fixed at 0.5. Fixing the feedback factor at 0.5 reduces the loop bandwidth of the low-dropout regulator by a factor of 0.5 and increases the loop gain by a factor of 2, which increases the settling time of the low-dropout regulator to a load step. However, reference generator 718 of flipped voltage follower low-dropout regulator 700 includes buffer 722, which provides the advantage of decoupling the loop bandwidth of flipped voltage follower low-dropout regulator 700 from the feedback factor. Thus, although flipped voltage follower low-dropout regulator 700 has a feedback factor of 0.5, flipped voltage follower low-dropout regulator 700 maintains unity gain, i.e., the gain of transistor 706 to output node VLDOOUT remains at one, and does not have the increased settling time of other low-dropout regulator architectures.

Figure 9:
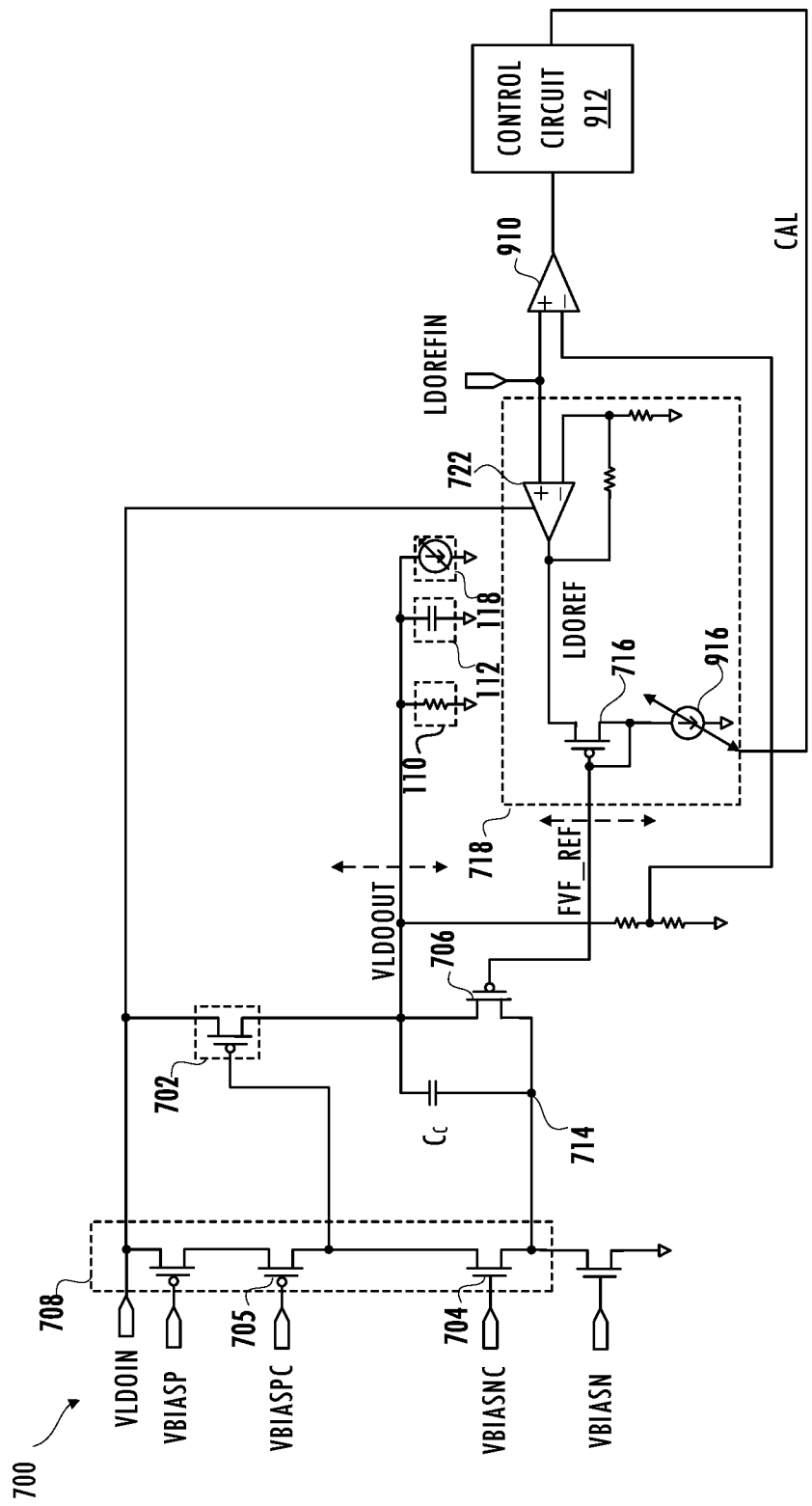
FIG. 9 illustrates an exemplary technique for calibrating the flipped voltage follower low-dropout regulator of FIG. 8 consistent with at least one embodiment of the invention.

In at least some embodiments of flipped voltage follower low-dropout regulator 700, manufacturing variations cause mismatch of devices that can cause a voltage offset on output signal VLDOOUT. Referring to FIG. 9, if transistor 706 and transistor 716 of reference generator 718 match, then the voltage level of output signal VLDOOUT is two times the target voltage level, e.g., 2×LDOREFIN. In at least one embodiment of flipped voltage follower low-dropout regulator 700, transistor 706, transistor 705, or transistor 704 deviates from a target size due to manufacturing mismatch, which causes the relationship of the current through transistor 706 to the current through inherent common-gate amplifier circuit 708 to vary from a target relationship, thereby causing output signal VLDOOUT to deviate from the target voltage level. Since output signal VLDOOUT follows gate bias FVF_REF, a technique for calibrating flipped voltage follower low-dropout regulator 700 for a total voltage offset (e.g., voltage offset due to manufacturing variations or other source of voltage offset) includes adjusting gate bias FVF_REF to compensate for the total voltage offset.

In at least one embodiment, during startup of a device including flipped voltage follower low-dropout regulator 700, comparator 910 compares output signal VLDOOUT to an input reference signal LDOREFIN, which is used to generate reference signal LDOREF. Control circuit 912, which may be a finite state machine or microcontroller unit, adjusts a predetermined value of digital control code CAL for a digital-to-analog conversion that compensates for the voltage offset and causes output signal VLDOOUT to have the target voltage level. In an embodiment of flipped voltage follower low-dropout regulator 700, digital control code CAL determines the output current of variable current source 916 that generates bias voltage FVF_REF. In at least one embodiment, control circuit 912 uses a conventional technique for determining digital control code CAL that compensates for the mismatch, e.g., increases digital control code CAL incrementally until the output of comparator 910 changes state. In at least one embodiment of the calibration technique, to reduce or eliminate effects of offset error of comparator 910, control circuit 912 determines values for digital control code CAL twice, swapping the inputs of comparator 910 in the second iteration. Control circuit 912 then averages the values to determine a final value of digital control code CAL. Control circuit 912 stores the final value of digital control code CAL in non-volatile memory for use during steady state operation of flipped voltage follower low-dropout regulator 700.

Thus, a flipped voltage follower low-dropout regulator topology that has a fast response to load steps, including large load steps, and a slow response to input reference steps is described. The flipped voltage follower low-dropout regulator topology of FIGS. 7 and 8 has a slow response to input reference changes. The response to the input reference changes is determined by the unity gain frequency of the flipped voltage follower reference generator. The response to the input reference changes is slower for a flipped voltage follower low-dropout regulator using a common gate amplifier inherent in a folded cascode circuit without additional bias circuitry or quiescent current for frequency compensation as compared to other low-dropout regulators using that technique for frequency compensation. The flipped voltage follower low-dropout regulator provides fast load regulation and high power supply noise rejection and is easily scaled for different current loads and output capacitances. For a predetermined maximum current load, the output decoupling capacitor scales with few changes in the topology, e.g., only the compensation capacitor is scaled according to scaling of the output decoupling capacitance. The flipped voltage follower low-dropout regulator described above draws less than 10% of the power for a maximum load. In an embodiment, the flipped voltage follower low-dropout regulator draws a first amount of power and a load draws at most a second amount of power, the first amount being less than 5% of a sum of the first amount of power and the second amount of power. In an embodiment of the flipped voltage follower low-dropout regulator, the output settles to within a few mV of a target voltage in a few nanoseconds in response to a load step of 5% to 100% of maximum current load. For an input supply voltage greater than 1.05V and a target output voltage of 0.85V, an embodiment of the flipped voltage follower low-dropout regulator provides greater than 20 dB power supply noise rejection for a package resonance frequency range of 50 MHz to 500 MHz.

The description of the invention set forth herein is illustrative and is not intended to limit the scope of the invention as set forth in the following claims. The terms "first," "second," "third," and so forth, as used in the claims, unless otherwise clear by context, are to distinguish between different items in the claims and do not otherwise indicate or imply any order in time, location, or quality. For example, "a first received signal" and "a second received signal," do not indicate or imply that the first received signal occurs in time before the second received signal. Variations and modifications of the embodiments disclosed herein may be made based on the description set forth herein, without departing from the scope of the invention as set forth in the following claims.

What is claimed is:

1. A voltage regulator comprising:
   an input power supply node;
   an output regulated power supply node;
   a flipped voltage follower circuit comprising:
      an output transistor configured as a common-source amplifier circuit, a source terminal of the output transistor being coupled to the input power supply node and a drain terminal of the output transistor being coupled to the output regulated power supply node;
      a folded cascode feedback circuit comprising a folding node, the folded cascode feedback circuit being configured to receive an output regulated voltage on the output regulated power supply node and to provide a feedback signal to a gate terminal of the output transistor,
      a reference generator configured to generate a bias signal for the folded cascode feedback circuit based on a reference voltage and a voltage offset calibration signal; and
   a compensation capacitor coupled to the output regulated power supply node and the folding node.

2. The voltage regulator as recited in claim 1 wherein the folded cascode feedback circuit comprises:
   a first transistor coupled to the output regulated power supply node and the folding node; and
   a second transistor coupled to the folding node and the gate terminal of the output transistor.

3. The voltage regulator as recited in claim 2 wherein the first transistor and the output transistor have a first type and the second transistor has a second type, the second type being complementary to the first type.

4. The voltage regulator as recited in claim 2 wherein the output transistor is at least an order of magnitude larger than the first transistor.

5. The voltage regulator as recited in claim 2 wherein the output transistor is at least ten times larger than the first transistor.

6. The voltage regulator as recited in claim 2 wherein the first transistor and the output transistor are p-type transistors and the second transistor is an n-type transistor.

7. The voltage regulator as recited in claim 2 wherein the folding node is coupled to a second drain terminal of the first transistor and a second source terminal of the second transistor.

8. The voltage regulator as recited in claim 2 wherein the second transistor is a cascode transistor included in an inherent common-gate amplifier.

9. The voltage regulator as recited in claim 1,
   wherein the folded cascode feedback circuit further comprises a common-gate amplifier having a gain $A_{CG}$, and
   wherein the compensation capacitor has a size of approximately $C_M/A_{CG}$, where $C_M$ is a Miller compensation capacitance.

10. The voltage regulator as recited in claim 1 wherein the voltage regulator has a first transient response to a change in a reference target voltage that is at least one order of magnitude slower than a second transient response to a second change in a current load.

11. The voltage regulator as recited in claim 1 wherein the voltage regulator further comprises a first current source coupled between the input power supply node and the gate terminal of the output transistor and a second current source coupled to the folding node.

12. The voltage regulator as recited in claim 1 wherein the voltage regulator draws a first amount of power and a load draws at most a second amount of power, the first amount being less than 5% of a sum of the first amount of power and the second amount of power.

13. The voltage regulator as recited in claim 1 wherein the flipped voltage follower circuit further comprises:
   a calibration circuit configured to generate the voltage offset calibration signal based on a voltage offset on the output regulated power supply node and the reference voltage.

14. A method for voltage regulation, the method comprising:
   receiving an input power supply voltage on an input power supply node;
   regulating a regulated output voltage on an output power supply node using a flipped voltage follower circuit, the input power supply voltage, and a feedback signal; and
   compensating a frequency response of the regulated output voltage by capacitively coupling the output power supply node to a folding node of the flipped voltage follower circuit,
   wherein the regulating includes biasing the flipped voltage follower circuit based on a reference voltage and a voltage offset calibration signal.

15. The method as recited in claim 14 wherein in response to the compensating, a unity gain bandwidth of the flipped voltage follower circuit is less than a frequency of a second dominant pole of the flipped voltage follower circuit.

16. The method as recited in claim 14, wherein a folded error amplifier of the flipped voltage follower circuit has a gain $A_{CG}$ and the compensating uses a compensation capacitor having a size of approximately $C_M/A_{CG}$, where $C_M$ is a Miller compensation capacitance.

17. The method as recited in claim 14 wherein the regulating has a first transient response to a change in a reference target voltage that is at least one order of magnitude slower than a second transient response to a second change in a current load.

18. An integrated circuit comprising:
a flipped voltage follower low-dropout regulator configured to generate a regulated output voltage on an output power supply node in response to an input power supply voltage on an input power supply node, the flipped voltage follower low-dropout regulator having a folding node; and
means for compensating a frequency response of the regulated output voltage using negative feedback to the folding node,
wherein the flipped voltage follower low-dropout regulator comprises a means for biasing the flipped voltage follower low-dropout regulator based on a reference voltage and for calibrating the flipped voltage follower low-dropout regulator for a voltage offset on the output power supply node.

19. The integrated circuit as recited in claim 18 wherein the flipped voltage follower low-dropout regulator has a first transient response to a change in a reference target voltage that is at least one order of magnitude slower than a second transient response to a second change in a current load.

20. The integrated circuit as recited in claim 18 wherein the flipped voltage follower low-dropout regulator draws a first amount of power and a load draws at most a second amount of power, the first amount being less than 5% of a sum of the first amount of power and the second amount of power.

* * * * *